United States Patent [19]
Sagawa et al.

[11] Patent Number: 5,448,197
[45] Date of Patent: Sep. 5, 1995

[54] FREQUENCY CONVERSION CIRCUIT AND MIXING CIRCUIT INCLUDING THE SAME

[75] Inventors: Morikazu Sagawa, Tama; Kazuaki Takahashi, Kawasaki; Kouei Misaizu, Kawasaki; Makoto Takemoto, Kawasaki, all of Japan

[73] Assignee: Matsushita Electric Industrial Co., Ltd., Japan

[21] Appl. No.: 191,527

[22] Filed: Feb. 4, 1994

[30] Foreign Application Priority Data

Feb. 5, 1993 [JP] Japan ................................. 5-018376
Dec. 22, 1993 [JP] Japan ................................. 5-325066

[51] Int. Cl.⁶ ..................... H04B 1/28; H03B 19/00
[52] U.S. Cl. .......................... 327/408; 327/113; 327/355; 455/333
[58] Field of Search ............... 327/355, 356, 360, 361, 327/408, 113, 114, 115, 116, 117, 118, 122, 105; 455/333; 381/119; 329/358, 362

[56] References Cited

U.S. PATENT DOCUMENTS

| | | | |
|---|---|---|---|
| 4,090,139 | 5/1978 | Hoover | 455/333 |
| 4,112,373 | 9/1978 | Miyamoto et al. | 455/333 |
| 4,814,649 | 3/1989 | Young | 455/333 |
| 5,083,050 | 1/1992 | Vasile | 455/333 |
| 5,306,969 | 4/1994 | Kimura | 327/105 |

FOREIGN PATENT DOCUMENTS

| | | | |
|---|---|---|---|
| 62-18809 | 1/1987 | Japan . | |
| 2-168733 | 6/1990 | Japan . | |
| 2274105 | 11/1990 | Japan | 455/333 |

*Primary Examiner*—Timothy P. Callahan
*Assistant Examiner*—Terry L. Englund
*Attorney, Agent, or Firm*—Parkhurst, Wendel & Rossi

[57] ABSTRACT

A frequency conversion circuit for mixing first and second frequency signals to supply an output frequency signal comprises: first and second FETs having first and second gates for receiving the first and second frequency signals respectively; and a third FET having a third gate ac-grounded, the first to third FETs being connected in series such that a current flowing through the current circuit between the source and drain is controlled by the first to third gates, the third FET being provided between the first and second FETs. The third FET may also be provided between connection an end of the series connector and the second FET in accordance with frequency differences between the first and second frequency signals and between the second frequency signal and the output frequency signal. A triple gate FET can be used in place of these three FETs connected in series. A quad gate FET can be used also. A mixing circuit including the frequency conversion circuit mentioned above is also disclosed.

9 Claims, 14 Drawing Sheets

FREQUENCY CONVERSION CIRCUIT AND MIXING CIRCUIT INCLUDING THE SAME

BACKGROUND OF THE INVENTION

1. Field of the Invention

This invention relates to a frequency conversion circuit for converting a frequency of a first frequency signal using a second frequency input signal and to a mixing circuit including the frequency conversion circuit.

2. Description of the Prior Art

A frequency conversion circuit having a single mixer comprising a dual gate FET (field effect transistor) for converting a frequency of a first input signal using a second input signal is known.

FIG. 18 is a schematic circuit diagram of a prior art frequency conversion circuit using a dual gate FET, In FIG. 18, numeral 1 is an input terminal for receiving a local oscillation (LO) signal. Numeral 2 is an input terminal for receiving a radio frequency (RF) signal. Numeral 3 is an IF (intermediate frequency signal) output terminal. Numeral 4 is a first gate bias voltage terminal. Numeral 5 is a second gate bias voltage terminal, Numeral 6 is a voltage source terminal. Numeral 7 is a matching circuit for matching the local oscillation signal with this frequency conversion circuit, Numeral 8 is a matching circuit for matching the radio frequency with this frequency conversion circuit. Numeral 9 is an IF matching circuit for matching the IF output signal with an external circuit. Numeral 10 is a dual gate FET having a pair of gates with respect to a pair of drain and source electrodes.

This prior art frequency conversion circuit using the dual gate FET is supplied with a supply voltage through the voltage source terminal 6 and biased with gate bias voltages applied to the first and second gate bias voltage terminals 4 and 5. The local oscillation signal is inputted to the dual gate FET 10 through the terminal 1 via the matching circuit 7 for impedance matching. The radio frequency signal is inputted to the dual gate FET 10 through the terminal 2 via the matching circuit 8 for impedance matching. The dual gate FET 10 mixes the local oscillation signal with the radio frequency signal to produce the IF output signal. The IF output signal is outputted through the matching circuit 9 with impedance matching.

This prior art frequency conversion circuit using the dual gate FET 10 can mix the local oscillation signal with the radio frequency signal with a relatively high frequency separation characteristic between the input terminals 1 and 2 for the local oscillation and radio frequency signals at a relatively low frequency. Thus, this structure requires no filter for the separation between the terminals of the local oscillation and radio frequency signals.

However, in the above-mentioned structure, if the frequencies of the radio signal and the local oscillation signal are set to the higher values, the original separation characteristic between the first and second gates becomes insufficient. Therefore, there is a problem that leaks of the local oscillation signal to the antenna side and the radio frequency signal to the local oscillation side become considerable, so that filters may be required to suppress the leaks.

Moreover, a mixing circuit including such prior art frequency conversion circuit for mixing the radio frequency signal and local frequency signal is known wherein matching circuits for impedance matching for amplifiers for radio frequency signal and local frequency signal are used. However, if the frequencies of the radio signal and the local oscillation signal are set to the higher values, the original separation characteristic between the first and second gates becomes insufficient. Therefore, there is a problem that leaks of the local oscillation signal to the antenna side and the radio frequency signal to the local oscillation side become considerable and matching circuit for impedance matching for amplifiers cannot prevent leak components from the intermediate frequency output from entering the frequency conversion circuit.

SUMMARY OF THE INVENTION

The present invention has been developed in order to remove the above-described drawbacks inherent to the conventional frequency conversion circuit and the conventional mixing circuit.

According to the present invention there is provided a frequency conversion circuit for mixing first and second frequency signals to supply an output frequency signal comprising: a current circuit having: first and second FETs having first and second gates for receiving the first and second frequency signals respectively; a third FET having a third gate; and an ac-grounding circuit for ac-grounding the third gate, the first to third FETs being connected in series such that a current flowing through the current circuit is controlled by the first to third gates, one end of the current circuit being ac-grounded, the other end being supplied with a supply voltage and supplying the output frequency signal, the third FET being provided between the first and second FETs when signal separation is required between the first and second frequency signal or between the other end and the second FET when the signal separation is required between the second frequency signal and the output frequency signal. The third FET may be provided between the first and second FETs or between the other end and the second frequency signal in accordance with frequency differences between the first and second frequency signal and between the second frequency signal and the output frequency signal. A triple gate FET can be used in place of these three FETs connected in series.

In the case that signal separation is required both between the first and second frequency signals and between the second frequency signal and the output frequency signal, a quad gate FET is used and the ac-grounding circuits are provided between the first and second frequency signals and between the second frequency signal and the output frequency signal. That is, there is provided a frequency conversion circuit for mixing first and second frequency signals to supply an output frequency signal comprising: a current circuit having: first and second FETs having first and second gates for receiving the first and second frequency signals respectively; a third FET having a third gate; a fourth FET having a fourth gate; and first and second ac-grounding circuits for ac-grounding the second and third gates respectively, the first to fourth FETs being connected in series such that a current flowing through the current circuit is controlled by the first to fourth gates, one end of the current circuit being ac-grounded, the other end being supplied with a supply voltage and supplying the output frequency signal, the third FET being provided between the first and second FETs, the fourth FET being provided between the other end and the second FET. A quad gate FET can be used in place of these four FETs connected in series.

According to the present invention there is provided a mixing circuit comprising: a first matching circuit for receiving a first frequency signal; a first amplifier including a first gate FET circuit having first and second gates, a first source, and a first drain, the first and second gates controlling a first current flowing between the first source and the first drain, an output of the first matching circuit being supplied to the first gate, the first matching circuit effecting impedance matching to the the first gate, the second gate and the source being ac-grounded, the first amplifier amplifying the first frequency signal; a second matching circuit for receiving a second frequency signal; a second amplifier including a second FET circuit having third and fourth gates, a second source, and a second drain, the third and fourth gates controlling a second current flowing between the second source and the second drain, an output of the second matching circuit being supplied to the third gate, the second matching circuit effecting impedance matching to the the third gate, the fourth gate and the second source being ac-grounded, the second amplifier amplifying the second frequency signal; a mixer including an FET circuit having fifth to seventh gates, a third source, and a third drain, the fifth and seventh gates controlling a third current flowing between the third source and drain and provided between the third source and drain in order of mention; a first coupling circuit for coupling an output of the first amplifier to the fifth gate; and a second coupling circuit for coupling an output of the second amplifier to the seventh gate, the sixth gate being ac-grounded, the mixer mixing the output of the first amplifier and the output of second amplifier.

According to the present invention there is provided a mixing circuit comprising: a first matching circuit for receiving a first frequency signal; a first amplifier including a first gate FET circuit having first and second gates, a first source, and a first drain, the first and second gates controlling a first current flowing between the first source and the first drain, an output of the first matching circuit being supplied to the first gate, the first matching circuit effecting impedance matching to the the first gate, the second gate and the source being ac-grounded, the first amplifier amplifying the first frequency signal; a second matching circuit for receiving a second frequency signal; a second amplifier including a second FET circuit having third and fourth gates, a second source, and a second drain, the third and fourth gates controlling a second current flowing between the second source and the second drain, an output of the second matching circuit being supplied to the third gate, the second matching circuit effecting impedance matching to the the third gate, the fourth gate and the second source being ac-grounded, the second amplifier amplifying the second frequency signal; a mixer including an FET circuit having fifth to seventh gates, a third source, and a third drain, the fifth and seventh gates controlling a third current flowing between the third source and drain and provided between the third source and drain in order of mention; a first coupling circuit for coupling an output of the first amplifier to the sixth gate; and a second coupling circuit for coupling an output of the second amplifier to the seventh gate, the fifth gate being ac-grounded, the mixer mixing the output of the first amplifier and the output of second amplifier.

BRIEF DESCRIPTION OF THE DRAWINGS

The object and features of the present invention will become more readily apparent from the following detailed description taken in conjunction with the accompanying drawings in which.

The same or corresponding elements or parts are designated as like references throughout the drawings.

DETAILED DESCRIPTION OF THE INVENTION

Hereinbelow will be described a first embodiment of this invention.

Figure 1:
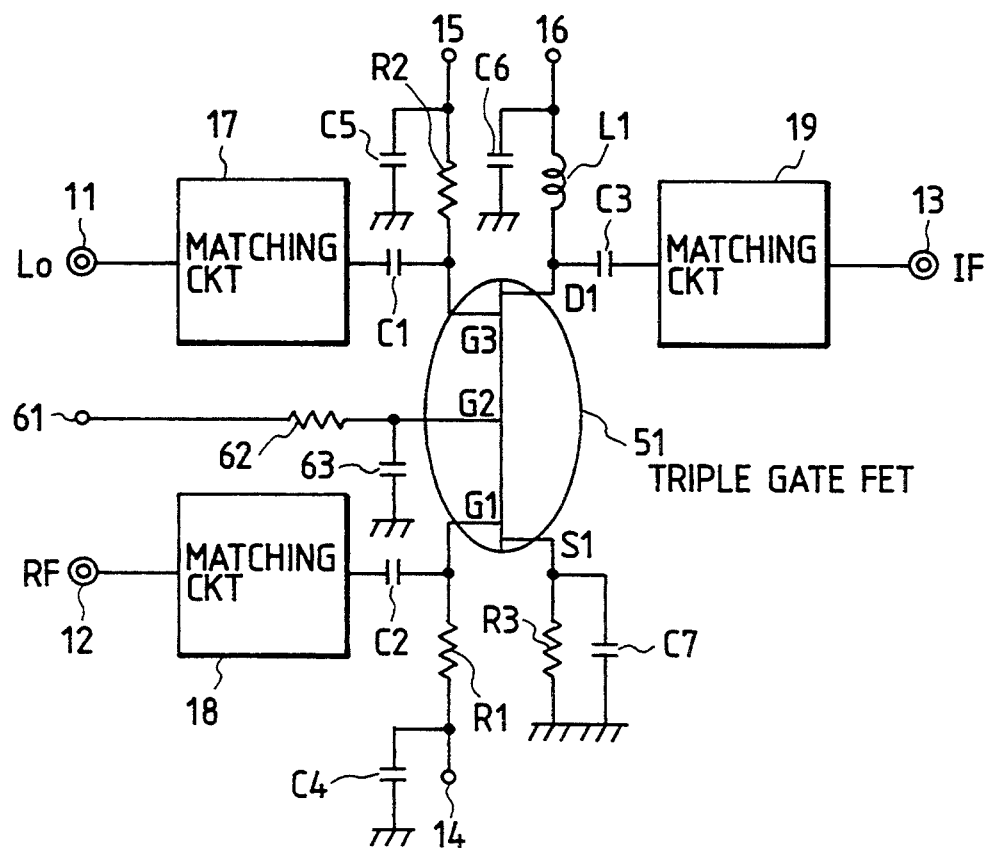
FIG. 1 is a schematic circuit diagram of the first embodiment of a frequency conversion circuit.

FIG. 1 is a schematic circuit diagram of the first embodiment of a frequency conversion circuit. In FIG. 1, numeral 11 is an input terminal for receiving a local oscillation (LO) signal. Numeral 12 is an input terminal for receiving a radio frequency (RF) signal. Numeral 13 is an IF (intermediate frequency signal) output terminal. Numeral 14 is a first gate bias voltage terminal. Numeral 61 is a second gate bias voltage terminal. Numeral 15 is a third bias voltage terminal. Numeral 16 is a voltage source terminal. Numeral 17 is a matching circuit for effecting impedance matching of the signal line (not shown) supplied with the local oscillation signal to this frequency conversion circuit. Numeral 18 is a matching circuit for effecting impedance matching of the signal line (now shown) supplied with the radio frequency signal to this frequency conversion circuit. Numeral 19 is a matching circuit for effecting impedance matching of the IF output signal to an external circuit. Numeral 51 is a triple gate FET (field effect transistor) having three gates G1, G2, and G3 with respect to a pair of drain and source electrodes. References C1 to C7 are capacitors. References R1 to R3 are resistors. Reference L1 is an inductor.

This frequency conversion circuit using the, triple gate FET is supplied with a supply voltage through the voltage source terminal 16 and biased with gate bias voltages through the first and third gate bias voltage terminals 14 and 15. The local oscillation signal is inputted to the triple gate FET 51 through the terminal 11 via the matching circuit 17 for impedance matching. The radio frequency signal is inputted to the triple gate FET 51 through the terminal 12 via the matching circuit 18 for impedance matching. In addition to this, the second gate terminal 61 is provided which is connected to the second gate G2 through a resistor 62 and the gate G2 is connected to ground through a capacitor 63. That is, the gate G2 is ac-grounded. The triple gate FET 51 mixes the local oscillation signal with the radio frequency signal to produce the IF output signal. The IF signal is outputted through the matching circuit 19 with impedance matching.

Figure 2:
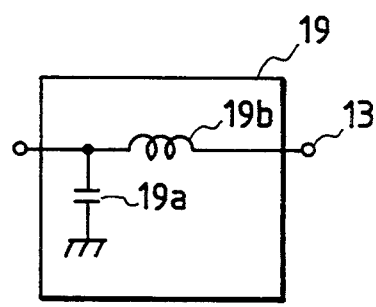
FIG. 2 is a schematic circuit diagram of a portion of the first embodiment for showing a matching circuit shown in FIG. 1.

FIG. 2 is a schematic circuit diagram of the first embodiment of the matching circuit 19. The matching circuit 19 comprises a capacitor 19a of which one end is connected to an input terminal thereof and the other end is connected to the ground and an inductor 19b of which one end is connected to the input terminal and the other end is connected to the output terminal 13. The matching circuit 19 is provided for matching the frequency conversion circuit of the first embodiment to an external circuit connected to the output terminal 13 as well as to selectively outputting the frequency difference signal between the local oscillation signal and the radio frequency signal. That is, the matching circuit 19 effects the impedance matching with respect to a frequency of a frequency difference signal and suppress a sum signal between the local oscillation signal and the radio frequency signal.

An operation of the frequency conversion circuit for outputting the frequency difference signal will be described. In connection with the biasing of the frequency conversion circuit using the triple gate FET 51, a drain voltage is applied to the drain D1 from the voltage source terminal 16 through the inductor L1, a first gate bias voltage to the first gate G1 is supplied from the first gate bias terminal 14 through the resistor R1, a second gate bias voltage to the second gate G2 is supplied from the voltage source terminal 61 through the resistor 62, a third gate bias voltage to the third gate G3 is supplied from the third gate bias terminal 15 through the resistor R2, and a source voltage is determined by a register feedback circuit.

The local oscillation signal inputted to the terminal 11 is applied to the third gate G3 through the matching circuit 17. The radio frequency signal inputted to the input terminal is applied to the first gate G1 through the matching circuit 18.

The second gate G2 is located between the first gate G1 and third gate G3, biased with an appropriate dc voltage and ac-grounded by the capacitor 63. The triple gate FET 51 mixes the local oscillation signal with the radio frequency signal to produce the frequency difference and sum signals. The matching circuit 19 outputs only the frequency difference signal as the intermediate frequency output signal. The intermediate frequency output signal is outputted at the terminal 13.

Figure 3:
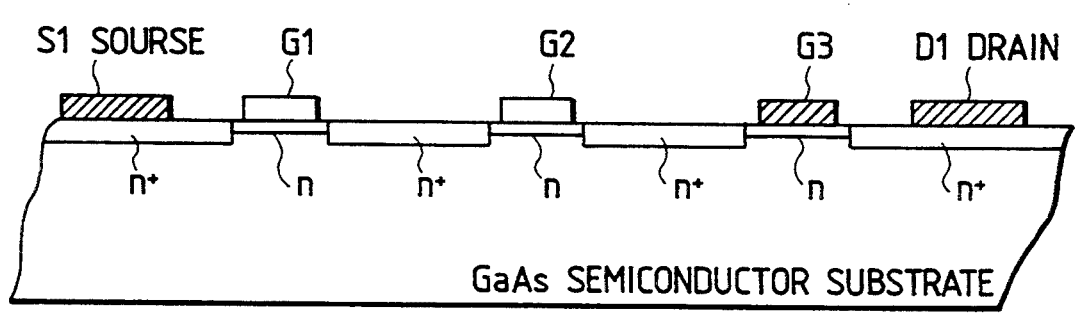
FIG. 3 is a cross-sectional view of the first embodiment for showing the triple gate shown in FIG. 1.

FIG. 3 is a cross-sectional view of the first embodiment for showing the triple gate FET 51. The triple gate FET 51 has the source S1, the drain D1, the first gate G1, the second gate G2, and the third gate G3 formed on a GaAs semiconductor substrate. The first gate G1, second gate G2, and the third gate G3 are provided between the source S1 and the drain D1 in order of mention to control a current between the source S1 and the drain D1. The first to third gate G1 to G3 controls a current flowing through channels which are formed adjacent to respective gates and are connected in series between the source S1 and the drain D1.

The separation characteristic between the local oscillation signal and the radio frequency signal is determined by stray capacitances between the gates G1 to G3 and the drain D1 of the triple gate FET 51. In the first embodiment, because the frequency difference signal is produced as the output of the frequency conversion circuit, the frequency of the local oscillation signal is close to that of the radio frequency signal. Therefore, it is required to suppress leak of the local oscillation signal to the signal line of the radio frequency signal. In the first embodiment, the second gate G2 is ac-grounded and is provided between the first gate G1 and the second gate G2, so that this positional relation prevents the leak of the local oscillation signal to the signal of the radio frequency signal or the first gate G1.

Figure 4:
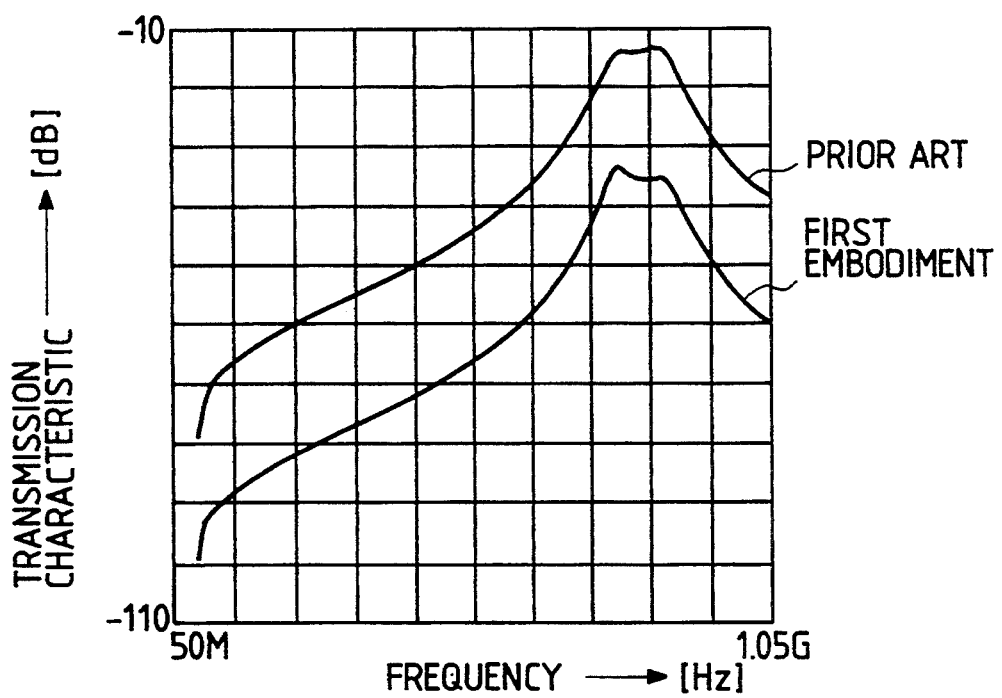
FIG. 4 shows analyzing results of transmission characteristics from the radio frequency signal to the local oscillation signal in the first embodiment and the prior art frequency conversion circuit.
Figure 18:
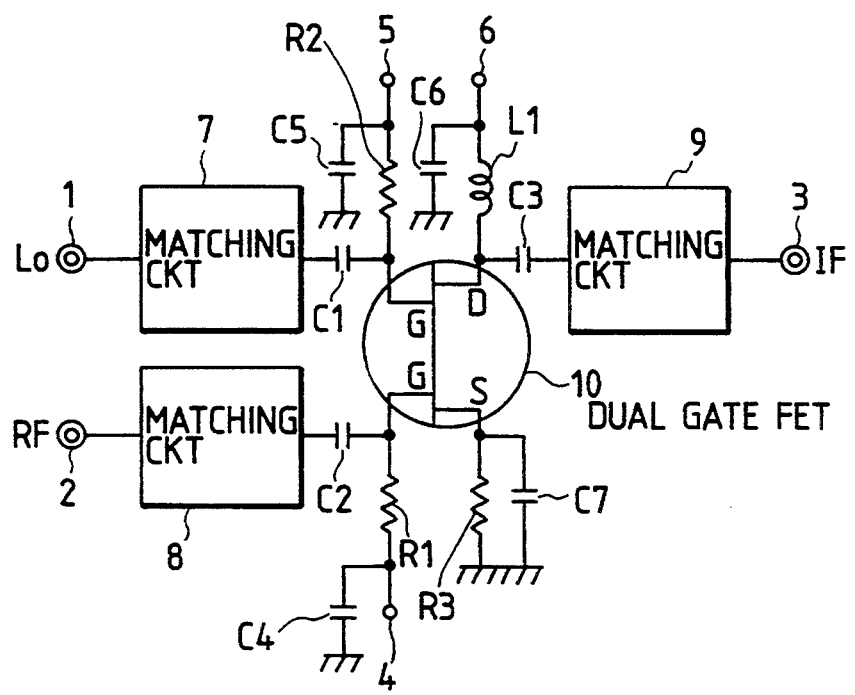
FIG. 18 is a schematic circuit diagram of a prior art frequency conversion circuit using a dual gate FET.

FIG. 4 shows analyzing results of transmission characteristics from the radio frequency signal to the local oscillation signal in the first embodiment and the prior art frequency conversion circuit shown in FIG. 18. The transmission characteristic is considered to represent the separation characteristics between the local oscillation signal and the radio frequency signal. It is assumed that the frequency of the local oscillation signal is 790 MHz, the frequency of the radio frequency signal is 880 MHz and the frequency of the IF signal is 90 MHz. Moreover, it is assumed that the stray capacitances between the first to third gates G1 to G3 and the drain D1 are about 0.4 pF. As shown in FIG. 4, the transmission characteristic from the local oscillation signal to the radio frequency signal in the first embodiment is improved by more than 20 dB compared with the prior art shown in FIG. 18. The capacitance necessary for ac-grounding is determined such that the impedance at the frequency of the signal to be grounded is less than ten ohms. If the frequency is 790 MHz, the capacitance should be more than 20 PF. If the frequency is 1 GHz, the capacitance should be more than 16 PF. This condition can be considered as the ac-grounded condition.

As mentioned above, there is provided the second gate ac-grounded which is located between the first gate G1 and the third gate G3, so that a high separation characteristic between the radio frequency signal and the local oscillation signal is obtained.

Figure 5:
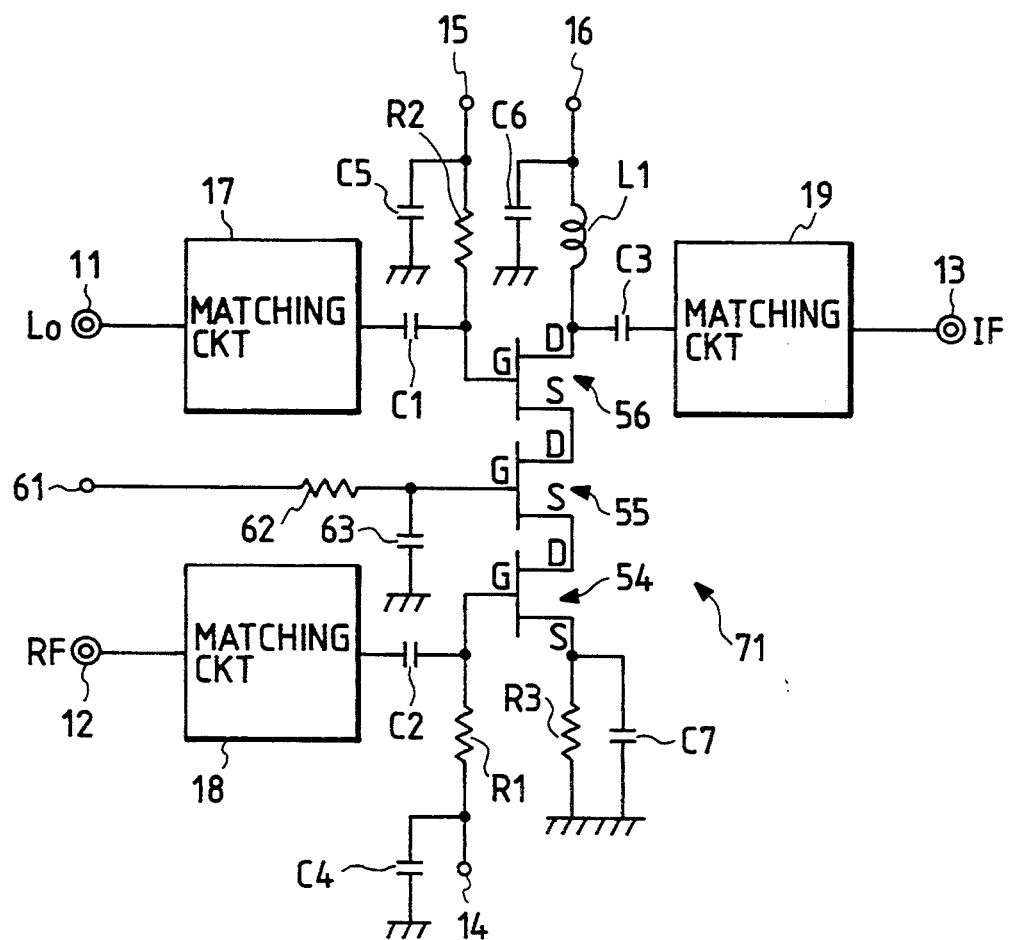
FIG. 5 is a schematic circuit diagram of a modification of the first embodiment.

FIG. 5 is a schematic circuit diagram of a modification of the first embodiment. The structure of a frequency conversion circuit of this modification is substantially the same as that of the first embodiment shown in FIG. 1. The difference is as follows:

The triple gate FET 51 is replaced by single gate FETs 54 to 56. A gate of the single gate FET 54 is connected to the matching circuit 18 through the capacitor C2 and to the terminal 14 through the resistor R1. A source of the single gate FET 54 is connected to the ground through the resistor R3 and capacitor C7. A drain of the single gat FET 54 is connected to a source of the single gate FET 55. A gate of the single gate FET 55 is connected to the terminal 61 through the resistor 62 and to the ground through the capacitor 63. A drain of the single FET 55 is connected to a source of the single FET 56. A gate of the single gate FET 56 is connected to the output of the matching circuit 17 through the capacitor C1 and to the terminal 15 through the resistor R2. The FETs 54 to 56 form a series circuit 71. A current flowing through the series circuit, that is, a current flowing through channels of the FETs 54 to 56 connected in series are controlled by the voltages of the gates of the single gate FETs 54 to 56. The operation of the frequency conversion circuit of this modification is same as that of the first embodiment shown in FIG. 1. Moreover, the leak of the local oscillation signal to the signal line of the radio frequency signal is prevented by the ac-grounding through the capacitor 63 similarly.

Figure 6:
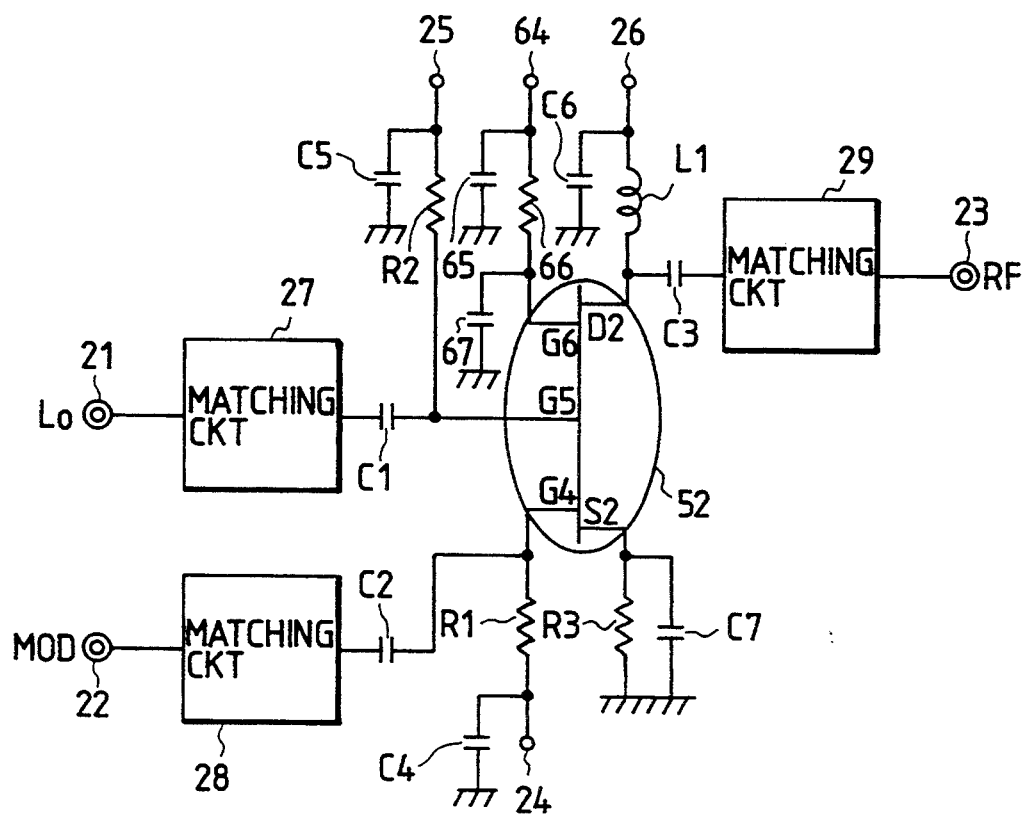
FIG. 6 is a schematic circuit diagram of a second embodiment of a frequency conversion circuit.

FIG. 6 is a schematic circuit diagram of a second embodiment of a frequency conversion circuit. The frequency conversion circuit of this embodiment outputs a sum signal as a radio frequency signal. That is, a frequency of a modification signal supplied to a first gate G4 of the triple gate FET 52 is remote from that of a local oscillation signal supplied to a second gate G5 but the frequency of the local oscillation signal is close to an output signal supplied from the drain D2 of the triple gate FET 52. Therefore, the leak between the signal line of the local oscillation signal and the output signal, namely, a radio frequency signal RF2 should be suppressed. Therefore, the ac-grounding is provided between the gate G5 and the drain D2, that is, the gate G6 is ac-grounded. Other basic structure is similar to that of the first embodiment.

Numeral 21 is an input terminal for receiving a local oscillation (LO) signal. Numeral 22 is an input terminal for receiving a modification (MOD) signal. Numeral 23 is an radio frequency output terminal. Numeral 24 is a first bias voltage terminal. Numeral 25 is a second bias voltage terminal. Numeral 26 is a voltage source terminal. Numeral 27 is a matching circuit for effecting impedance matching of the local oscillation signal to this frequency conversion circuit. Numeral 28 is a matching circuit for effecting impedance matching of the modification signal to this frequency conversion circuit. Numeral 29 is a matching circuit for effecting impedance matching of the RF output signal to an external circuit. Numeral 52 is a triple gate FET having three gates G4, G5, and G6 with respect to a pair of drain and source electrodes. Numeral 64 is a third gate bias voltage terminal for supplying a bias voltage to the third gate G6 through a resistor 66. The third gate G6 is also connected to a capacitor 67 for ac-grounding. References C1 to C7 are capacitors. References R1 to R3 are resistors. Reference L1 is the inductor.

This frequency conversion circuit using the triple gate FET 52 is supplied with dc bias voltage through the terminals 24 to 26. The local oscillation signal is inputted to the triple gate FET 52 through the terminal 21 via the matching circuit 17 for impedance matching. The modification signal is inputted to the triple gate FET 52 through the terminal 22 via the matching circuit 28 for impedance matching.

The triple gate FET 52 mixes the local oscillation signal with the modification signal to produce frequency sum and frequency difference signals. The matching circuit 29 provides the impedance matching with respect to the frequency of the sum signal. Therefore, the matching circuit 29 outputs only frequency sum signal as the radio frequency output signal. As mentioned above, the leak between the local signal supplied to the gate G5 and the frequency sum signal supplied from the output of the matching circuit 29 should be suppressed because the frequency of the local oscillation signal is close to the frequency sum signal. More specifically, a change in a load of the output of this frequency conversion circuit adversely effects a signal source of the local oscillation signal (not shown) due to the leak between the local signal supplied to the gate G5 and the frequency sum signal supplied from the drain D2. Therefore, the gate G6 provided between the gate G5 and the Drain D2 is ac-grounded by the capacitor 67.

Figure 7:
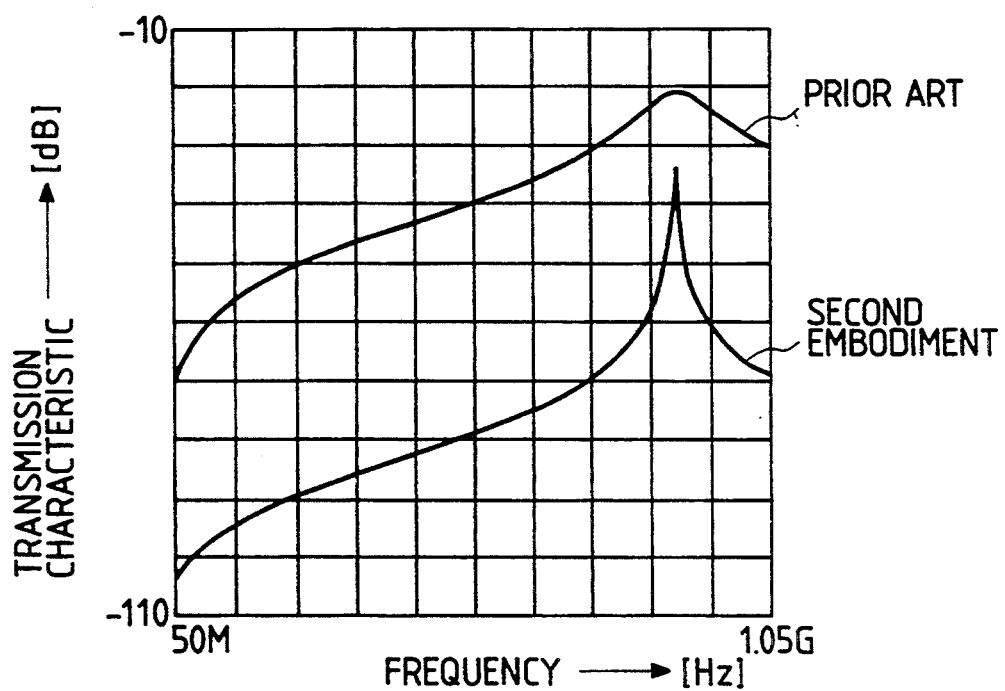
FIG. 7 shows analyzing results of transmission characteristics from the radio frequency signal to the local oscillation signal in the second embodiment and the prior art frequency conversion circuit using a dual gate FET.

FIG. 7 shows analyzing results of transmission characteristics from the radio frequency signal to the local oscillation signal in the second embodiment and the prior art frequency conversion circuit using a dual gate FET. It is assumed that the frequency of the local oscillation signal is 790 MHz, the frequency of the radio frequency signal is 880 MHz and the frequency of the modification signal is 90 MHz. Moreover, it is assumed that the stray capacitances between the gates G4 to G6 and the drain D2 are about 0.4 pF. This transmission characteristic represents the isolation characteristic between the signal line of the local oscillation signal and the sum output signal, i.e., the radio frequency signal. As shown in FIG. 7, the transmission characteristic from the local oscillation signal to the radio frequency signal in this second embodiment is improved by more than 10 dB compared with the prior art using a dual gate FET. The capacitance necessary for ac-grounding is determined in the similar manner to the first embodiment. The modification in the first embodiment shown in FIG. 5 is applicable to the second embodiment.

As mentioned above, there is provided the third gate ac-grounded between the second gate G5 and the drain D2, so that a high separation characteristic between the radio frequency signal and the local oscillation signal is obtained. This eliminates astable operation of the frequency conversion circuit of the second embodiment due to the leak of the sum signal to the signal line of the local oscillation signal.

It can be considered that the triple gate FET 51 or 52 is equivalent to a series circuit having three discrete single gate FETs as shown in FIG. 5. That is, the triple gate FET 51 or 52 comprises three FETs connected in series.

Figure 8:
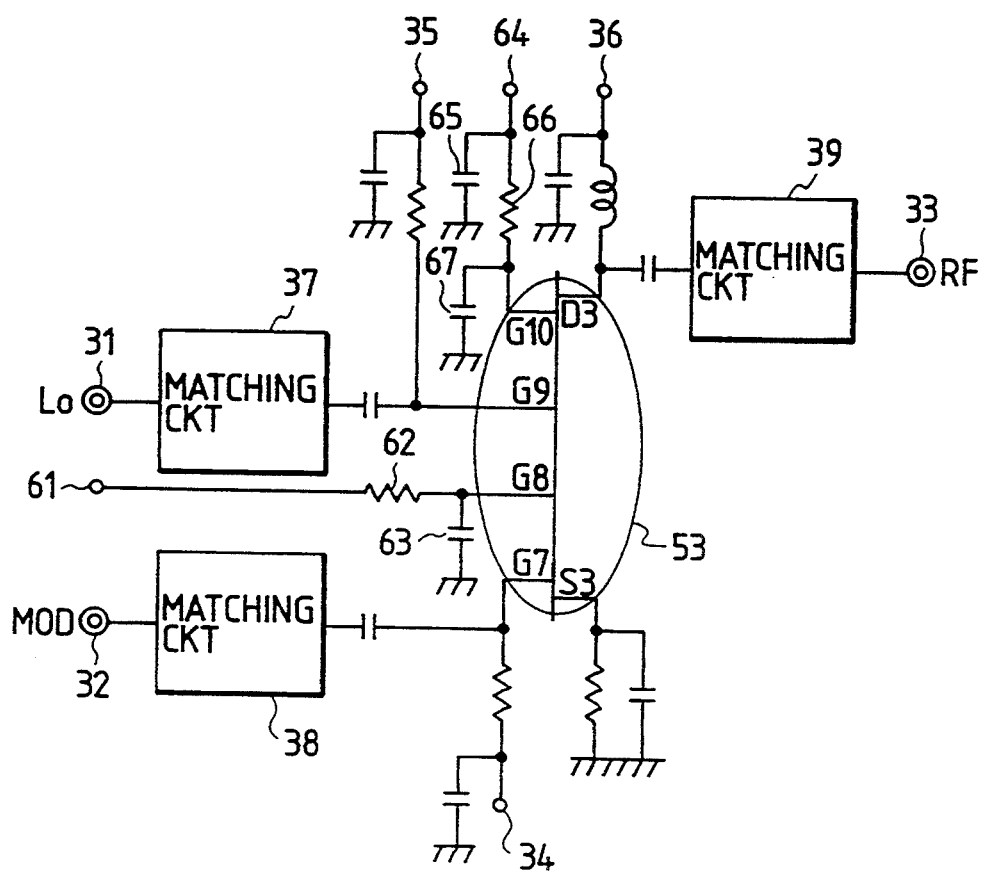
FIG. 8 is a schematic circuit diagram of a third embodiment of a frequency conversion circuit.

FIG. 8 is a schematic circuit diagram of a third embodiment of a frequency conversion circuit. The third embodiment is such that the first embodiment is combined with the second embodiment. That is, in place of the triple gate FET, a quad gate FET 53 is used. Moreover, a second gate provided between signal lines of the modification signal and the local oscillation signal and fourth gate provided between signal lines of the local oscillation signal and the drain D3 are ac-grounded.

Other basic structure is similar to that of the first and second embodiments.

Numeral 31 is an input terminal for receiving a local oscillation signal. Numeral 32 is an input terminal for receiving a modification signal. Numeral 33 is an radio frequency output terminal. Numeral 34 is a first bias voltage terminal. Numeral 61 is a second bias voltage terminal which is connected to the second gate G8 through a register 62 and the gate G8 is connected to ground through a capacitor 63. That is, the gate G8 is ac-grounded. Numeral 35 is a third bias voltage terminal. Numeral 36 is a voltage source terminal. Numeral 37 is a matching circuit for effecting impedance matching of the local oscillation signal to this frequency conversion circuit. Numeral 38 is a matching circuit for effecting impedance matching of the modification signal to this frequency conversion circuit. Numeral 39 is a matching circuit for effecting impedance matching of the RF output signal to an external circuit (not shown). Numeral 53 is a quad gate FET having first to fourth gates G7 to G10 with respect to a pair of drain and source electrodes. Numeral 64 is a fourth gate bias voltage terminal ac-grounded by a capacitor 67 for supplying a bias voltage to the fourth gate G10 through the resistor 66.

This frequency conversion circuit using the quad gate FET 53 is supplied with dc bias voltage through the terminals 34 to 36, 61 and 64. The local oscillation signal is inputted to the quad gate FET 53 through the terminal 31 via the matching circuit 37 for impedance matching. The modification signal is inputted to the quad gate FET 53 through the terminal 32 via the matching circuit 38 for impedance matching.

The quad gate FET 53 mixes the local oscillation signal with the modification signal to produce frequency sum and frequency difference signals. The matching circuit 39 provides the impedance matching with respect to the frequency of the sum signal. Therefore, the matching circuit outputs only frequency sum signal as the radio frequency output signal. As mentioned above, the leak between the local signal supplied to the gate G9 and the frequency sum signal supplied from the output of the matching circuit 39 should be suppressed because the frequency of the local oscillation signal is close to the frequency sum signal. Therefore, the gate G8 provided between the gate G10 and the Drain D3 is ac-grounded by the capacitor 63. Moreover, the leak between the signal line of the local oscillation signal and the signal line of the modification signal is also suppressed by the ac-grounded second gate G8. Therefore, the separation characteristic and the stability in the operation are improved.

In the third embodiment, the frequency conversion circuit outputting the sum signal. However, a frequency conversion circuit for outputting a difference signal can be obtained in the similar manner by changing the matching circuit 39.

Moreover, in the third embodiment, the quad gate FET 53 is used. However, four single gate FETs connected in series can be used in place of the quad gate FET 53 as described in the modification of the first embodiment.

Figure 9:
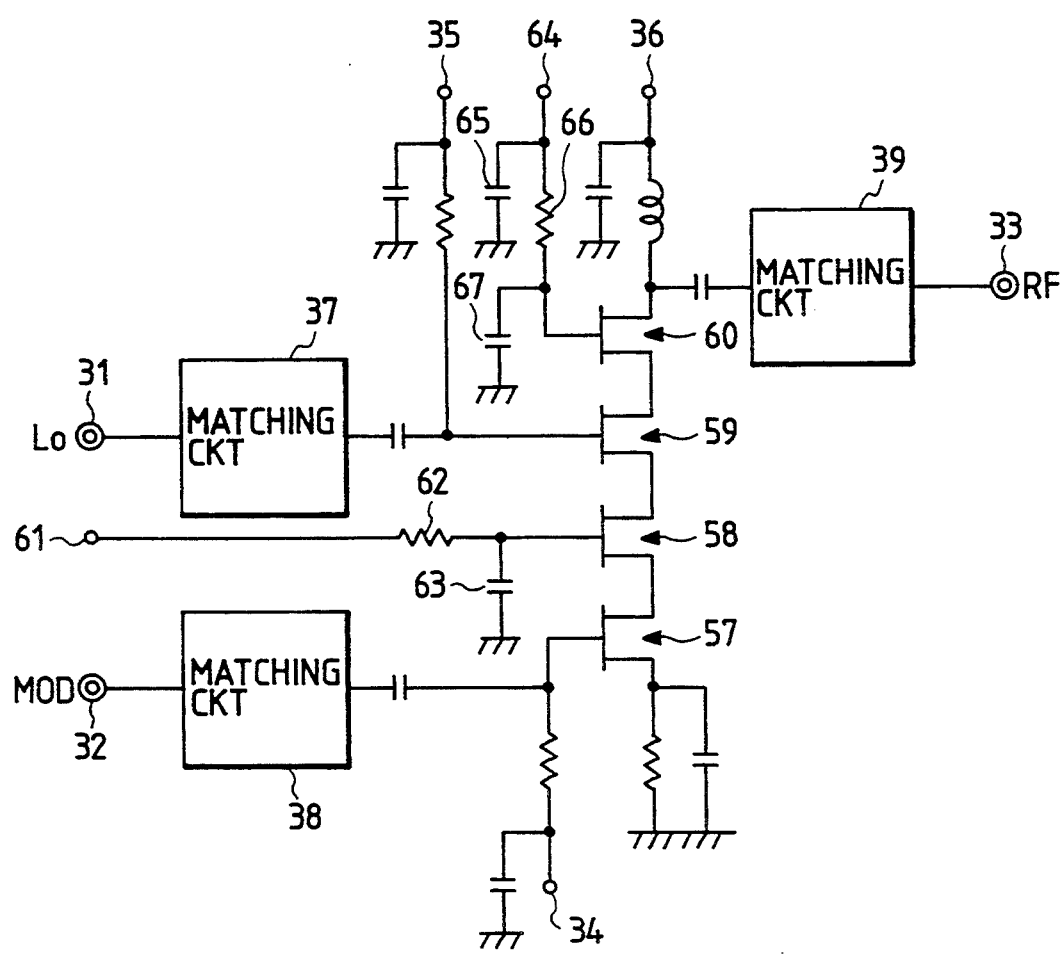
FIG. 9 is a schematic circuit diagram of such a modification of the third embodiment.

FIG. 9 is a schematic circuit diagram for showing such a modification of the third embodiment. This modification is made in the similar manner to the modification of the first embodiment. That is, the quad gate FET 53 is replaced by four single gate FETs 57 to 60. Operation is similar to the third embodiment.

Moreover, two dual gate FETs connected in series can be used. Further, two single gate FETs and one dual gate FET can be used in place of the quad gate FET 53.

In the first to third embodiments, gates are biased through resistors and the drains are biased through inductors, and the sources are biased through resistor feedback circuits. However, the biasing circuits are not limited to these embodiments.

As mentioned above, in the frequency conversion circuit for supplying a frequency difference output signal, an additional FET ac-grounded is provided between the local oscillation signal and the radio frequency signal where the signal separation is required. Therefore, the triple gate FET is used and the second gate of the triple gate FET provided between the signal lines of the local oscillation signal and the radio frequency signal is ac-grounded to improve the separation characteristic.

In the frequency conversion circuit for supplying a sum output signal, an additional FET ac-grounded is added between the local oscillation signal and the output radio frequency signal where the signal separation is required.

Moreover, with the quad gate FET or four single gate FETs, between the signal line of the modulation signal and the local oscillation signal and between the signal line of the local oscillation signal and the drain D3 are ac-grounded to improve separation characteristic and provides a more stable operation.

Figure 10:
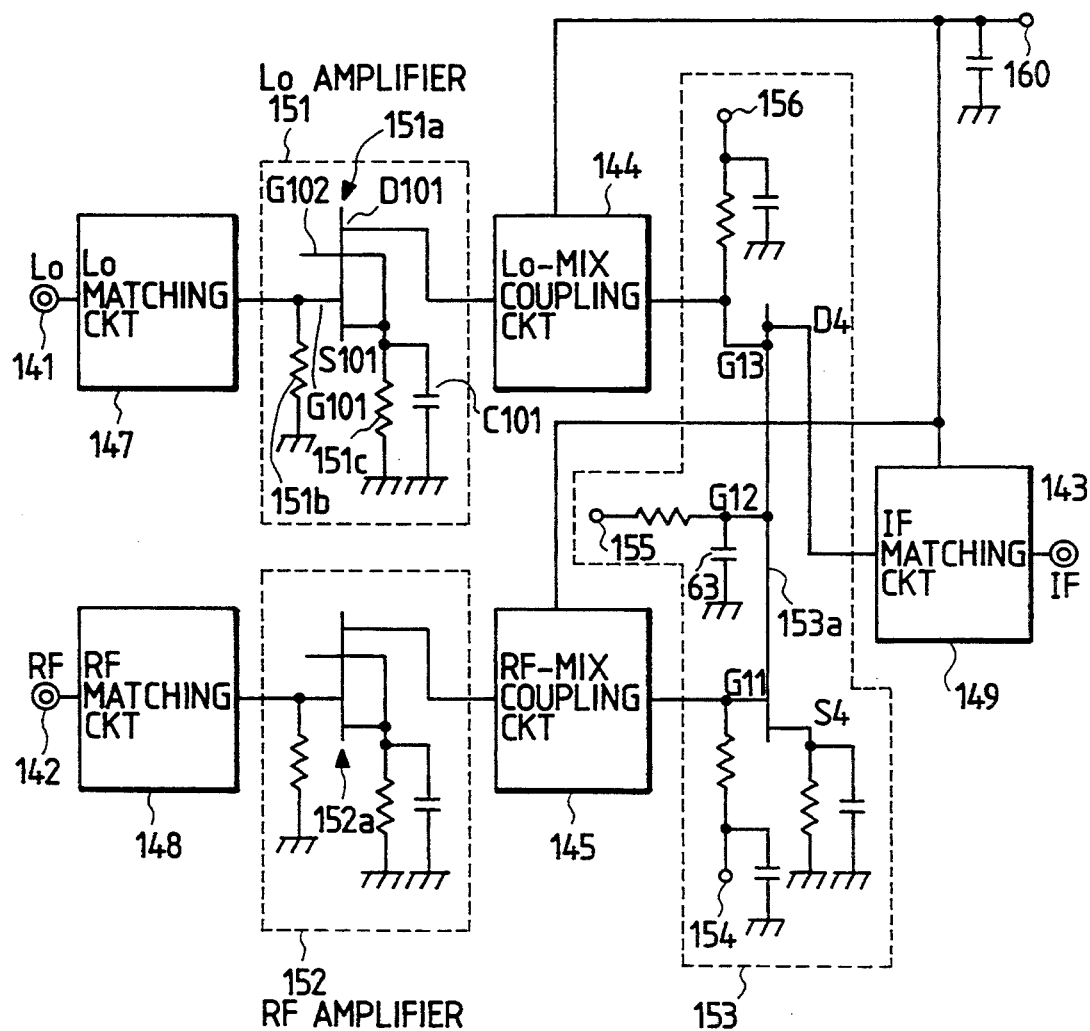
FIG. 10 is a schematic circuit diagram of a fourth embodiment for showing a front end circuit including the frequency conversion circuit.
Figure 11:
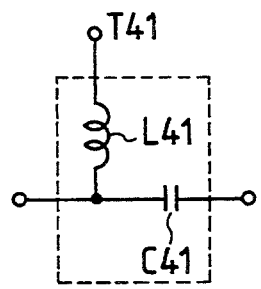
FIG. 11 is a schematic circuit diagram of a coupling circuit shown in FIG. 10.
Figure 12:
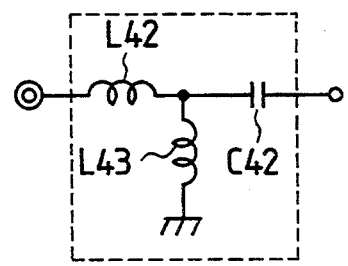
FIGS. 12 and 13 are schematic circuit diagrams of matching circuit shown in FIG. 10.
Figure 13:
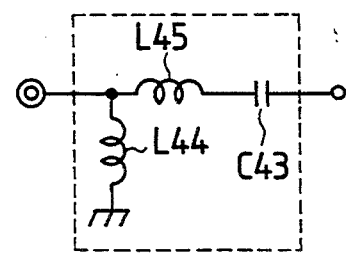

FIG. 10 is a schematic circuit diagram of a fourth embodiment for showing a front end circuit including the frequency conversion circuit described in the first embodiment. FIG. 11 is a schematic circuit diagram of a coupling circuit shown in FIG. 10. FIGS. 12 and 13 are schematic circuit diagrams of examples of matching circuits shown in FIG. 10.

In FIG. 10, numeral 141 is a local oscillation signal input terminal, numeral 142 is a radio frequency signal input terminal, number 143 is an IF output terminal, numeral 144 is a LO-MIX coupling circuit, numeral 145 is an RF-MIX coupling circuit, numeral 147 is a LO matching circuit, numeral 148 is an RF matching circuit, numeral 149 is an IF matching circuit, numeral 151 is a LO amplifier including a dual gate FET 151a, numeral 152 is an RF signal amplifier, and numeral 153 is a frequency conversion circuit including a triple gate FET 153a. The frequency conversion circuit 153 has substantially the same structure as the first embodiment. Numeral 154 is gate voltage terminal for a gate G11, numeral 155 is a gate voltage terminal for a gate G12, numeral 158 is a gate voltage terminal for a gate G13. Numeral 160 is a supply voltage terminal. The gate G12 is ac-grounded by a capacitor 63 and biased through a resistor. The triple gate FET 153a can be replaced by three discrete FETs as described with FIG. 5.

The coupling circuit shown in FIG. 11 is used for the LO-MIX circuit 144 or the RF-MIX circuit 145. However, the values of elements included in the L0-MIX circuit 144 and the RF-MIX circuit 145 are different each other because frequencies of signals inputted thereto are different. The coupling circuit shown in FIG. 11 comprises an inductor L41 whose one end is connected to an input terminal thereof and the other end is connected to a voltage terminal T41 receiving a supply voltage from the supply voltage terminal 160 and a capacitor C41 whose one end is connected to the input terminal thereof and the other end is provided for an output terminal.

The matching circuit 147 has a circuit structure shown in FIG. 12 or 13. The matching circuit 148 has the circuit structure shown in FIG. 12 or 13 also. The matching circuit shown in FIG. 12 comprises an inductor L42 whose one end is connected to an input terminal thereof, a capacitor C42 connected to the inductor L42 in series, and an inductor L43 connected between a junction point of the inductor L42 and the capacitor C42 and the ground. The matching circuit shown in FIG. 13 comprises an inductor L45 whose one end is connected to an input terminal thereof and a capacitor C43 connected in series, and an inductor L44 connected between the input terminal and the ground.

Operation of the front end circuit will be described.

A local oscillation signal is supplied to a LO amplifier 151 through the local frequency input terminal 141 and the matching circuit 147. The structure of the local frequency amplifier 151 is basically the same as the RF amplifier 152. However, values of resistors and capacitors included in those circuits are different in accordance with the frequency of the inputted signal thereinto. The LO amplifier 151 comprises a dual gate FET 151a having gates G102 and G102. The gate G101 is supplied with an output of the matching circuit 147 and connected to the ground with a resistor 151b. The gate G102 and a source of the dual gate FET 151a is connected to the ground through a capacitor C101 for ac-grounding and a resistor 151c. The amplifier 151 amplifies the local frequency signal. An output of the amplifier 151 is supplied to a coupling circuit 144 from the drain D101 of the dual gate FET 151a. The structure of the LO-MIX coupling circuit 144 has the circuit structure shown in FIG. 11. The amplified local frequency signal is supplied to the gate G13 of the triple gate FET 153a through the capacitor C41 of the LO-MIX coupling circuit 144 and an output terminal thereof. On the other hand, intermediate frequency components which may enter the circuits and signal lines before the coupling circuit 144 from the output of the triple gate FET 153a is shorted to the supply power through the inductor L41 in the LO-MIX coupling circuit 144. In other words, the inductance value of the inductor L41 is selected to pass the intermediate frequency component signal and stops the amplified local frequency signal which has a higher frequency than the intermediate frequency component signal. The inductor L41 is also provided to supply a drain bias voltage to the dual gate FET 151a.

On the other hand, the radio frequency signal supplied from an antenna (not shown) is supplied to the RF amplifier 152 through the radio frequency signal input terminal 142 and the matching circuit 148. The structure of the RF amplifier 152 is basically the same as the local frequency amplifier 152 as mentioned above. The RF amplifier 152 comprises a dual gate FET 152a having two gates and amplifies the radio signal in a similar manner to the LO amplifier 151.

An output of the amplifier 152 is supplied to a RF-MIX coupling circuit 145 from the drain of the dual gate FET 152a. The structure of the RF-MIX coupling circuit 145 has a circuit structure shown in FIG. 11. The amplified radio frequency signal is supplied to the gate G11 of the triple gate FET 153a through the capacitor C41 of the RF-MIX coupling circuit 145 and an output terminal thereof. On the other hand, intermediate frequency components which may enter the circuits and signal lines before the coupling circuit 145 from the output of the triple gate FET 153a is shorted to the supply power through the inductor L41 of the RF-MIX coupling circuit 145. In other words, the inductance value of the inductor L41 of the RF-MIX coupling circuit 145 is selected to pass the intermediate frequency component signal and stops the radio frequency signal which has a higher frequency than the intermediate frequency component signal. The inductor L41 in the RF-MIX coupling circuit 145 is also provide to supply a drain bias voltage to the dual gate FET 152a.

The triple gate FET 153a mixes the amplified radio signal with the amplified local frequency to convert the frequency of the received radio frequency signal to the intermediate frequency to provide an intermediate frequency output signal through the intermediate frequency matching circuit 149 for impedance matching to an external circuit. The operation of the triple gate FET is similar to the first embodiment and the second gate G12 is ac-grounded by a capacitor 63, so that the separation characteristics between the intermediate frequency output and the circuits before the LO-MIX coupling circuit 144 and between the intermediate frequency output and the circuits before the RF-MIX coupling circuit 145 are improved by the circuit structure of the L0-MIX coupling circuit 144 and the RF-MIX coupling circuit 145. Moreover, the separation characteristics between the drains D11 and D13 are improved by the ac-grounded drain G12.

The coupling circuit shown in FIG. 11 supplies the drain voltage to the dual gate FET 151a or 152a from the supply power through the inductor L41 and amplified local oscillation signal or the amplified radio frequency signal to the triple gate FET 153a through the capacitor C41 by selecting a value of the capacitance of the capacitor C41 such that the capacitor C41 is in a short condition at the intermediate frequency. This provides output impedance matching of the amplifiers 151 or 152 and input impedance matching of the frequency conversion circuit, i.e., the triple gate FET 153a. That is, the coupling circuits 144 and 145 act as both output impedance matching circuit for the amplifiers 151 or 152 and input impedance matching circuit for the triple gate FET 153a. Thus, this provides a miniaturization and decrease in the number of parts of this front end circuit.

FIG. 12 is a schematic circuit diagram of a matching circuit shown in FIG. 10. The matching circuit shown in FIG. 12 is provided for matching the input impedance of the dual gate FET 151a or 152a, which shows a capacitive and high impedance at UHF band, to a signal source impedance, which is generally 50Ω. That is, in this matching circuit, the capacitor C42 prevents a direct current from flowing therethrough, or it allow an ac signal pass therethrough. The inductor L43 is connected between the junction point of the inductor and the capacitor C42 and the ground in parallel. This makes a real number part of the input impedance of the dual gate FET 151a or 152a 50Ω. The inductor L42 cancels the capacitive characteristic of the dual gate FET 151a or 152a. Moreover, this circuit structure shows that change in the impedance characteristic of this matching circuit is relatively low against dispersion of elements used in this matching circuit.

FIG. 13 is a schematic circuit diagram of a matching circuit shown in FIG. 10. The matching circuit shown in FIG. 13 also shows that change in the impedance characteristic of this matching circuit against dispersion of elements used in this matching circuit and provides a miniaturization and decrease in the number of parts of this front end circuit. That is, in FIG. 13, the capacitor C43 prevents a direct current from flowing therethrough, or it allows an ac signal pass therethrough. The inductor L44 is connected to the capacitor C43 in series to make a real part of an input admittance of the dual gate FET 151a or 152a 20 mS. Then, the inductor L44 is connected between the input terminal thereof and the ground to cancel the capacitive characteristic of the dual gate FET 151a or 152a. This circuit structure shows that change in the impedance characteristic of this matching circuit is relatively low against dispersion of elements used in this matching circuit as well as if the inductor is formed by a transmission line, an effect of capacitance between lines included in an inductor can be reduced because this circuit structure allows the inductance value to be low. Thus, a linearly formed transmission line can be used which is not subject to a capacitance between lines, so that this circuit structure is useful in the cases of HIC (hybrid integrated circuit) and MMIC where the effect of capacitance between lines is considerably large.

According to this embodiment, the triple gate FET 153a is used which shows a low distortion characteristic and the gate G12 is ac-grounded to reduce leak between the local oscillation signal and the radio frequency signal. Moreover, an amplitude of the local oscillation signal can be made low because there is provided the LO amplifier 151. These LO and RF amplifiers 151 and 152 provide low noise, low distortion and high separation characteristics. Further, the second gates of the dual gate FETs 151a and 152a are ac-grounded. This increases the separation characteristic further. Moreover, the coupling circuits 144 and 145 act as the output matching circuits of the amplifiers 151 and 152 and as input matching circuits of the triple gate FET 153a. This, the miniaturization and simplification of this front end circuit are provided.

There are two types of the matching circuit structures as shown in FIGS. 12 and 13. It is possible that both LO amplifier 151 and the RF amplifier 152 employ the same circuit structure or separate circuit structures from the circuit structures shown in FIGS. 12 and 13.

Figure 14:
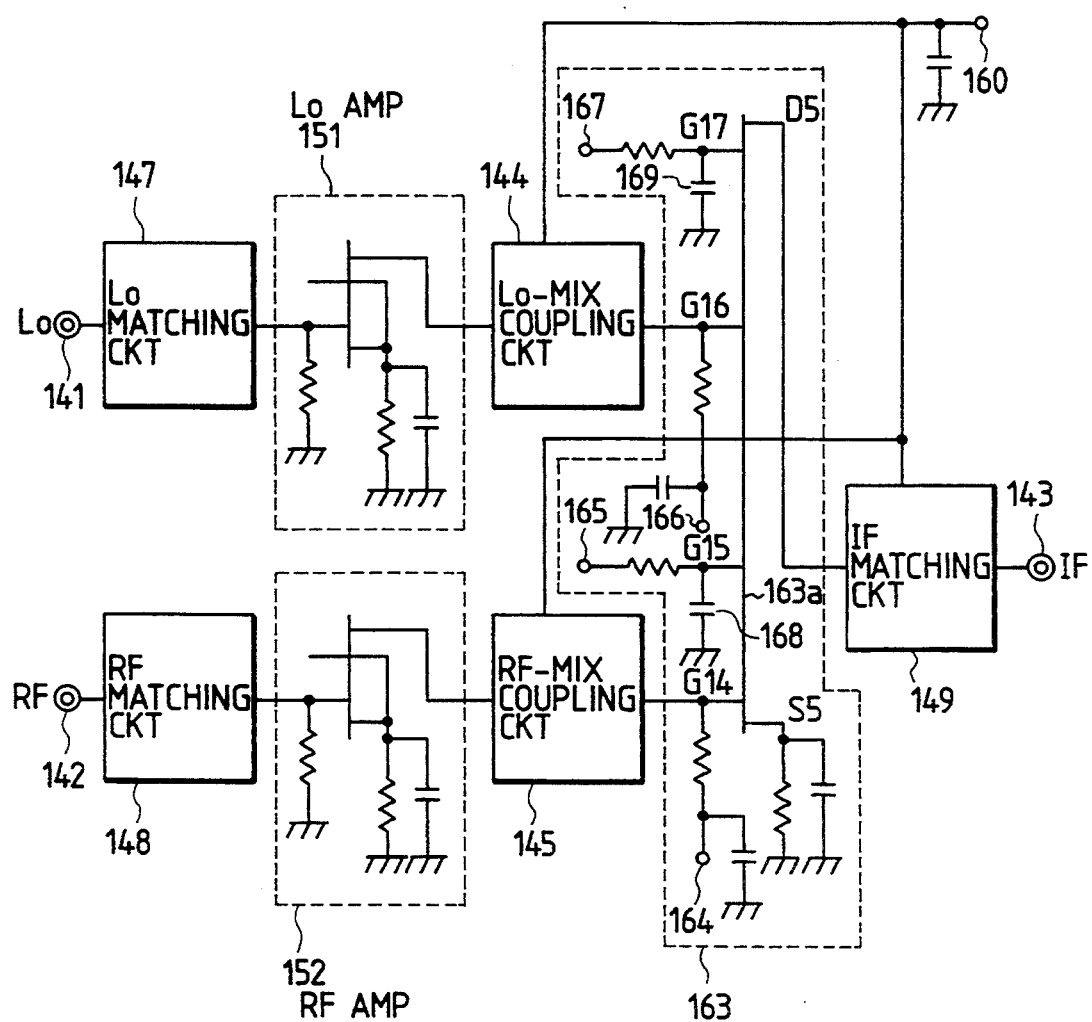
FIG. 14 is a schematic circuit diagram of a fifth embodiment of this invention for showing a front end circuit.

FIG. 14 is a schematic circuit diagram of a fifth embodiment of this invention for showing a front end circuit. The basic structure of the fifth embodiment is the same as the fourth embodiment. A difference is in that the number of the gates of the FET for mixing is four which was three in the fourth embodiment. Elements shown in FIG. 14 having the same references shown in FIG. 10 effect the same functions respectively. Numeral 163 is a frequency conversion circuit having a quad gate FET 163a, numeral 164 is a voltage terminal of a gate G14 supplied with the amplified radio frequency signal, numeral 165 is a voltage terminal of a gate G15 ac-grounded by a capacitor 168, numeral 166 is a voltage terminal of a gate G16 supplied with the amplified local oscillation frequency signal, and numeral 167 is a voltage terminal of a gate G17 ac-grounded by a capacitor 169.

The operation of the matching circuits 147 and 148, the LO amplifier 151 and RF amplifier 152, and LO coupling circuit 144 and RF coupling circuit 145 are the same as the fourth embodiment and the operation of the quad gate FET 163a is the same as the third embodiment. Therefore, the separation characteristics between the local oscillation signal and the radio frequency signal and between the local oscillation signal and the intermediate frequency output signal are improved.

Figure 15:
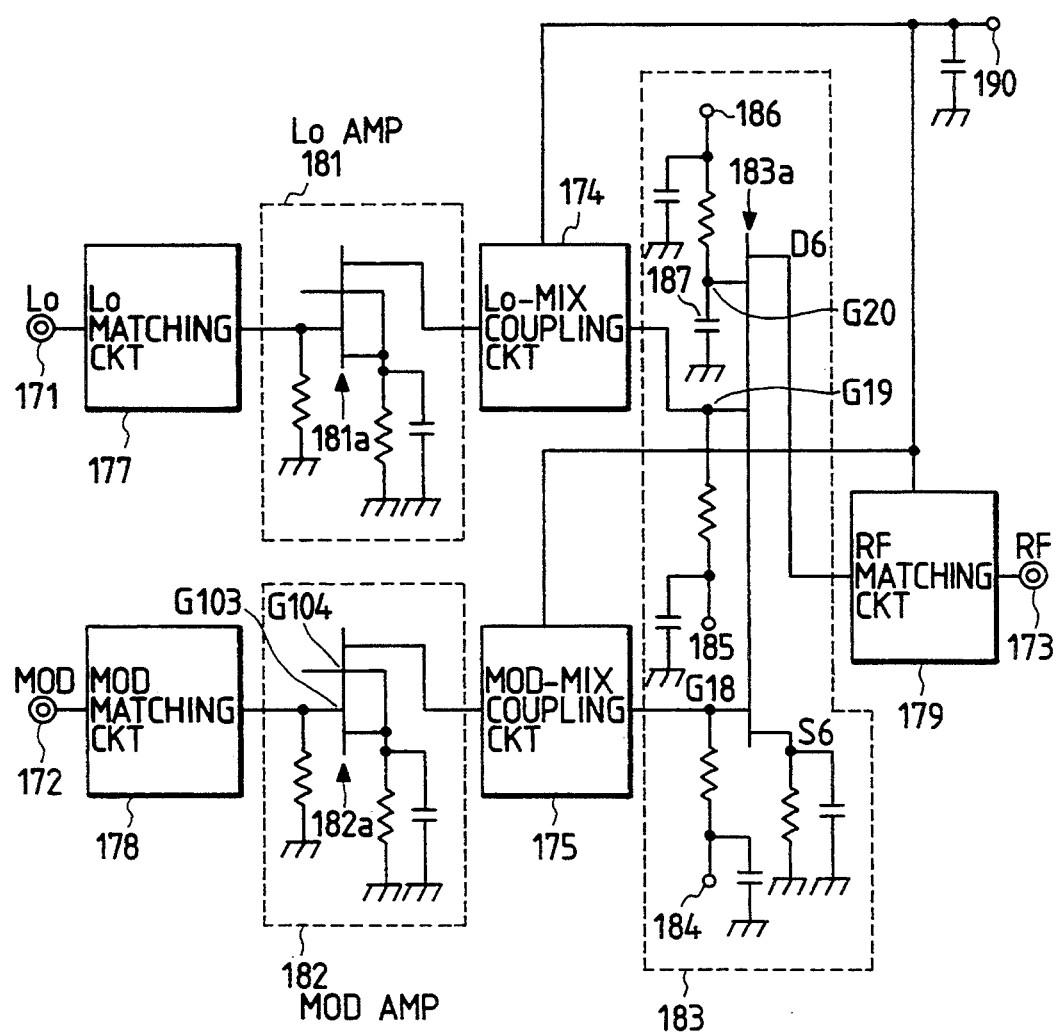
FIG. 15 is a schematic circuit diagram of a sixth embodiment for showing a frequency up mixer circuit.

FIG. 15 is a schematic circuit diagram of a sixth embodiment for showing a frequency up mixer circuit. In FIG. 15, numeral 171 is a local oscillation signal input terminal, numeral 172 is a modulation signal input terminal, number 173 is an RF output terminal, numeral 174 is a LO-MIX coupling circuit, numeral 175 is an MOD-MIX coupling circuit, numeral 177 is a LO matching circuit, numeral 178 is a M0D matching circuit, numeral 181 is a LO amplifier including a dual gate FET 181a, numeral 182 is a MOD amplifier, and numeral 183 is a frequency conversion circuit including a triple gate FET 183a. The frequency conversion circuit 183 has substantially the same structure as the first embodiment. Numeral 184 is gate voltage terminal for a gate G18, numeral 185 is a gate voltage terminal for a gate G19, numeral 186 is a gate voltage terminal for a gate G20. Numeral 190 is a supply voltage terminal. The gate G20 is ac-grounded by a capacitor 187 and biased through a resistor.

The LO-MIX coupling circuit 174 and the MOD-MIX coupling circuit 175 have the circuit structure shown in FIG. 11. However, the corresponding elements included in LO-MIX coupling circuit and the MOD-MIX coupling circuit 175 different values because frequencies inputted thereinto are different.

The LO matching circuit 177 has the structure shown in FIG. 12 or 13. The MOD matching circuit 178 has the structure shown in FIG. 12 or 13 also.

Operation of the front end circuit of the sixth embodiment will be described.

The triple gate FET 183a mixes the local oscillation signal with the modulation signal to produce frequency sum and frequency difference signals. The RF matching circuit 179 provides the impedance matching with respect to the frequency of the sum signal. Therefore, the RF matching circuit 179 outputs only the frequency sum signal as the radio frequency output signal. As mentioned above, the leak between the local signal supplied to the gate G19 and the frequency sum signal coming from the output of the drain D6 or the output of the matching circuit 179 should be suppressed because the frequency of the local oscillation signal is close to the frequency sum signal. More specifically, a change in a load of the output of this frequency conversion circuit adversely effects a signal source of the local oscillation signal (not shown) due to the leak between the local signal supplied to the gate G19 and the frequency sum signal supplied from the drain D6. Therefore, the gate G20 provided between the gate G19 and the Drain D6 is ac-grounded by the capacitor 187.

The LO matching circuit 177, the LO amplifier 181, and the LO-MIX coupling circuit 174 operate in the similar manner to the corresponding circuits of fourth and fifth embodiments. The MOD matching circuit 178 and the M0D amplifier 182, and the MOD-MIX coupling circuit 175 operate in the similar manner to the RF matching circuit 148 and the RF amplifier 152, and the RF-MIX coupling circuit 145 shown in FIG. 10. However, the values of elements between these corresponding circuits are different each other because the frequency of the modulation signal is lower than that of the radio frequency signal.

The tripe gate FET 183a operates in the similar manner to the triple gate FET 52 of the second, embodiment shown in FIG. 6.

Figure 16:
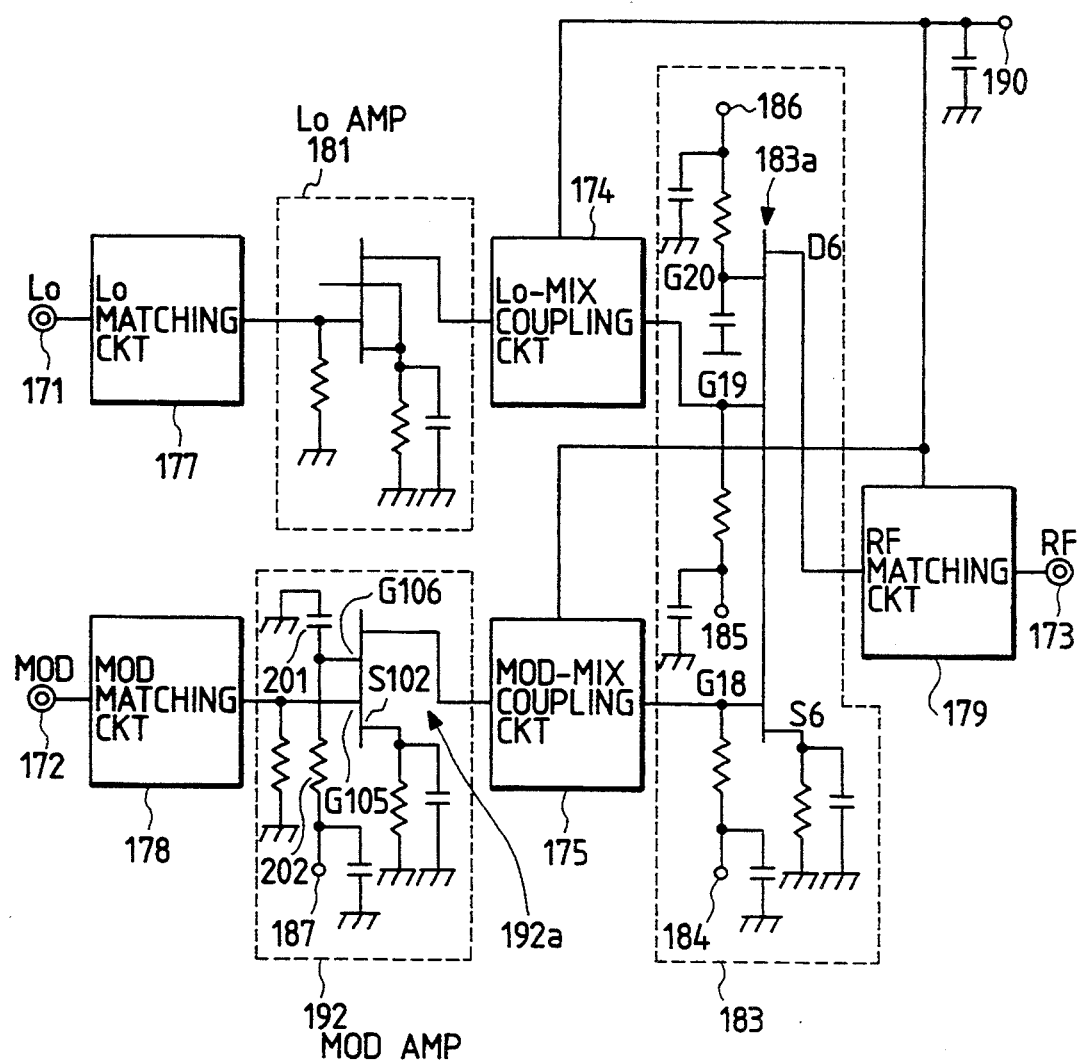
FIG. 16 is a schematic circuit diagram of a seventh embodiment for showing a frequency up mixer.

FIG. 16 is a schematic circuit diagram of a seventh embodiment for showing a frequency up mixer. The basic structure of the seventh embodiment is basically the same as that of the sixth embodiment. A difference is in that the MOD amplifier 182 is replaced by a MOD amplifier 192. More specifically, the gate G106 of a dual gate FET 192a is not connected to the source S102 but ac-grounded by a capacitor 201 and biased through a resistor 202 by a bias voltage from a voltage terminal 187. The controlling of the voltage value of the bias voltage to the voltage terminal 187 changes an output level of the amplified modulation signal, so that an output level of the radio frequency signal which is a frequency sum signal is controlled by the voltage value of the bias voltage supplied to the voltage terminal 187. The other structure and operation are the same as the sixth embodiment.

Figure 17:
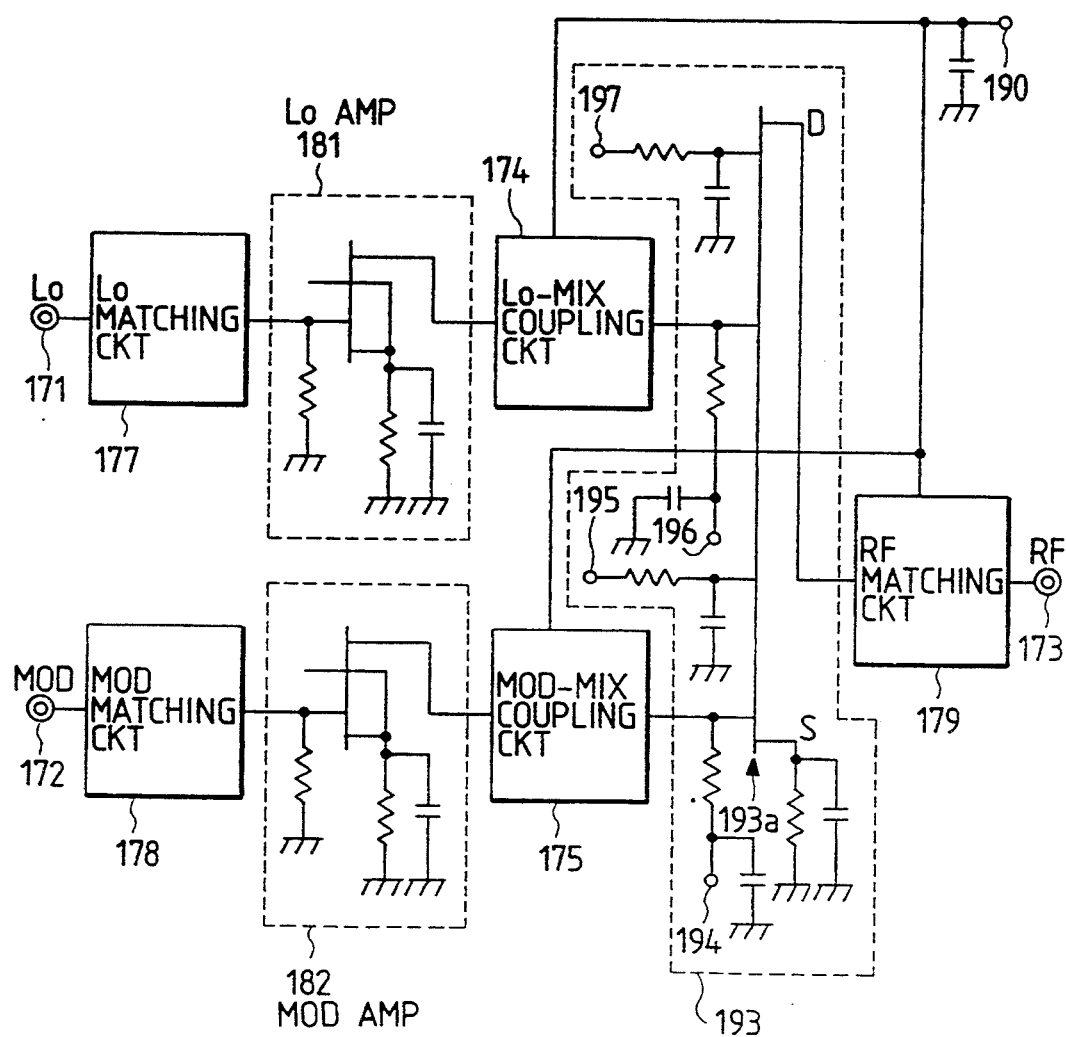
FIG. 17 is a schematic circuit diagram of an eighth embodiment for showing a frequency up mixing circuit.

FIG. 17 is a schematic circuit diagram of an eighth embodiment for showing a frequency up mixing circuit. The basic structure of the eighth embodiment is basically the same as that of the third and sixth embodiments. That is, the structure including the LO matching circuit 177, LO amplifier 181, LO-MIX coupling circuit 174, MOD matching circuit 178, MOD amplifier 182, and the MOD-MIX coupling circuit 175 have the same structure as the sixth embodiment and the operation is also the same. The quad gate FET 193a is the same as the quad gate FET 53 shown in FIG. 8 and the operation is also the same.

In the eighth embodiment, the amplifier 182 can be replaced by the amplifier 192 as similar to the seventh embodiment.

What is claimed is:

1. A frequency conversion circuit for mixing first and second frequency signals to supply an output frequency signal comprising: a current circuit having:
   (a) first and second FETs having first and second gates for receiving said first and second frequency signals respectively;
   (b) a third FET having a third gate; and
   (c) ac-grounding means for ac-grounding said third gate, said first to third FETs being connected in series such that a current flowing through said current circuit is controlled by said first to said third gates, one end of said current circuit being ac-grounded, the other end being supplied with a supply voltage and supplying said output frequency signal, said third FET being provided between said first and second FETs when signal separation is required between said first and second frequency signals or between said other end and said second FET when said signal separation is required between said second frequency signal and said output frequency signal.

2. A frequency conversion circuit for mixing first and second frequency signals to supply an output frequency signal comprising: a current circuit having:
   (a) first and second FETs having first and second gates for receiving said first and second frequency signals respectively;
   (b) a third FET having a third gate; and
   (c) ac-grounding means for ac-grounding said third gate, said first to third FETs being connected in series such that a current flowing through said current circuit is controlled by said first to third gates, one end of said current circuit being ac-grounded, the other end being supplied with a supply voltage and supplying said output frequency signal, said third FET being provided between said first and second FETs when a frequency of said second frequency signal is closer to that of said first frequency signal than that of said output frequency signal or between said other end and said second FET when said frequency of said second frequency signal is closer to that of said output frequency signal than that of said first frequency signal.

3. A frequency conversion circuit for mixing first and second frequency signals to supply a frequency difference signal comprising: a current circuit having:
   (a) first and second FETs having first and second gates for receiving said first and second frequency signals respectively;
   (b) a third FET having a third gate; and
   (c) ac-grounding means for ac-grounding said third gate, said first to third FETs being connected in series such that a current flowing through said current circuit is controlled by said first to third gates, one end of said current circuit being ac-grounded, the other end being supplied with a supply voltage and supplying said output frequency signal, said third FET being provided between said first and second FETs.

4. A frequency conversion circuit for mixing first and second frequency signals to supply an output frequency signal comprising: a current circuit having:
   (a) first and second FETs having first and second gates for receiving said first and second frequency signals respectively;
   (b) a third FET having a third gate and a fourth FET having a fourth gate; and
   (c) first and second ac-grounding means for ac-grounding said second and fourth gates respectively, said first to fourth FETs being connected in series such that a current flowing through said current circuit is controlled by said first to fourth gates, one end of said current circuit being ac-grounded, the other end being supplied with a supply voltage and supplying said output frequency signal, said third FET being provided between said first and second FETs, said fourth FET being provided between said other end and said second FET.

5. A frequency conversion circuit for mixing first and second frequency signals to supply an output frequency signal comprising:
   (a) a triple gate FET having a drain, a source, first to third gates for controlling a current flowing between said drain and source, said first to third gates provided between said drain and source in order of mention, said first and third gates receiving said first and second frequency signals respectively, said source being ac-grounded, said drain being supplied with a supply voltage and supplying said output frequency signal; and
   (b) ac-grounding means for ac-grounding said second gate.

6. A frequency conversion circuit for mixing first and second frequency signals to supply an output frequency signal comprising:
   (a) a triple gate FET having a drain, a source, first to third gates for controlling a current flowing between said drain and source, said first to third gates provided between said drain and source in order of mention, said first and second gates receiving said first and second frequency signals respectively, said source being ac-grounded, said drain being supplied with a supply voltage and supplying said output frequency signal; and (b) ac-grounding means for ac-grounding said third gate.

7. A frequency conversion circuit for mixing first and second frequency signals to supply an output frequency signal comprising:

(a) a quad gate FET having a drain, a source, first to fourth gates for controlling a current flowing between said drain and source, said first to fourth gates provided between said drain and source in order of mention, said first and third gates receiving said first and second frequency signals respectively, said source being ac-grounded, said drain being supplied with a supply voltage and supplying said output frequency signal;

(b) first ac-grounding means for ac-grounding said second gate; and (c) second ac-grounding means for ac-grounding said fourth gate.

8. A mixing circuit for mixing first and second frequency signals comprising:

(a) a first matching circuit for receiving said first frequency signal;

(b) a first amplifier including a first gate FET circuit having first and second gates, a first source, and a first drain, said first and second gates controlling a first current flowing between said first source and said first drain, and output of said first matching circuit being supplied to said first gate, said second gate and said source being ac-grounded, said first amplifier amplifying said first frequency signal;

(c) a second matching circuit for receiving said second frequency signal;

(d) a second amplifier including a second FET circuit having third and fourth gates, a second source, and a second drain, said third and fourth gates controlling a second current flowing between said second source and said second drain, an output of said second matching circuit being supplied to said third gate, said second matching circuit effecting impedance matching to the said third ate, said fourth gate and said second source being ac-grounded, said second amplifier amplifying said second frequency signal;

(e) mixing means including an FET circuit having fifth to seventh gates, a third source, and a third drain, said fifth and seventh gates controlling a third current flowing between said third source and drain and provided between said third source and drain in order of mention;

(f) a first coupling circuit for coupling an output of said first amplifier to said fifth gate; and (g) a second coupling circuit for coupling an output of said second amplifier to said seventh gate, said sixth gate being ac-grounded, wherein said mixing means mixes said output of said first amplifier and said output of second amplifier and supplies a mixed output signal to said third drain.

9. A mixing circuit for mixing first and second frequency signals comprising:

(a) a first matching circuit for receiving said first frequency signal;

(b) a first amplifier including a first gate FET circuit having first and second gates, a first source, and a first drain, said first and second gate controlling a first current flowing between said first source and said first drain, an output of said first matching circuit being supplied to said first gate, said first matching circuit effecting impedance matching to the said first gate, said second gate and said source being ac-grounded, said first amplifier amplifying said first frequency signal;

(c) a second matching circuit for receiving said second frequency signal;

(d) a second amplifier including a second FET circuit having third and fourth gates, a second source, and a second drain, said third and fourth gates controlling a second current flowing between said second source and said second drain, an output of said second matching circuit being supplied to said third gate, said second matching circuit effecting impedance matching to the said third gate, said fourth gate and said second source being ac-grounded, said second amplifier amplifying said second frequency signal;

(e) mixing means including an FET circuit having fifth to seventh gates, a third source, and a third drain, said fifth and seventh gates controlling a third current flowing between said third source and drain and provided between said third source and drain in order of mention;

(f) a first coupling circuit for coupling an output of said first amplifier to said sixth gate; and (g) a second coupling circuit for coupling an output of said second amplifier to said seventh gate, said fifth gate being ac-grounded, wherein said mixing means mixes said output of said first amplifier and said output of second amplifier and supplies a mixed output signal to said third drain.

* * * * *